(12) United States Patent  
van der Zanden et al.

(10) Patent No.: US 7,851,844 B2
(45) Date of Patent: Dec. 14, 2010

(54) MEMORY DEVICE HAVING CROSS-SHAPED SEMICONDUCTOR FIN STRUCTURE

(75) Inventors: Koen van der Zanden, Heverlee (BE); Thomas Schulz, Heverlee (BE)

(73) Assignee: Infineon Technologies AG, Neubiberg (DE)

( * ) Notice: Subject to any disclaimer, the term of this patent is extended or adjusted under 35 U.S.C. 154(b) by 326 days.

(21) Appl. No.: 12/013,969

(22) Filed: Jan. 14, 2008

(65) Prior Publication Data

US 2009/0179250 A1    Jul. 16, 2009

(51) Int. Cl.
  *H01L 29/788* (2006.01)
  *H01L 29/792* (2006.01)
  *H01L 21/3361* (2006.01)

(52) U.S. Cl. .............. 257/315; 257/324; 257/E29.3; 257/E29.309

(58) Field of Classification Search ........... 257/315, 257/324, E29.3, E29.309
  See application file for complete search history.

(56) References Cited

U.S. PATENT DOCUMENTS

| | | | | |
|---|---|---|---|---|
| 6,657,252 B2 * | 12/2003 | Fried et al. | ................... | 257/316 |
| 7,091,551 B1 * | 8/2006 | Anderson et al. | ........... | 257/324 |
| 7,629,640 B2 * | 12/2009 | She et al. | .................... | 257/324 |
| 2005/0199912 A1 * | 9/2005 | Hofmann et al. | ............. | 257/204 |
| 2005/0242391 A1 * | 11/2005 | She et al. | ..................... | 257/324 |
| 2006/0001058 A1 | 1/2006 | Dreeskornfeld et al. | | |
| 2006/0170031 A1 | 8/2006 | Kang et al. | | |
| 2006/0292781 A1 | 12/2006 | Lee | | |
| 2008/0001176 A1 | 1/2008 | Gopalakrishnan et al. | | |

OTHER PUBLICATIONS

Eitan, B., et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner*—Anh D Mai
(74) *Attorney, Agent, or Firm*—Slater & Matsil, L.L.P.

(57) ABSTRACT

In an embodiment, a memory device, including: a semiconductor fin structure, each end portion of the fin structure including a source/drain region; a charge storage layer covering at least a portion of the fin structure; and a gate layer covering at least a portion of the charge storage layer.

16 Claims, 5 Drawing Sheets

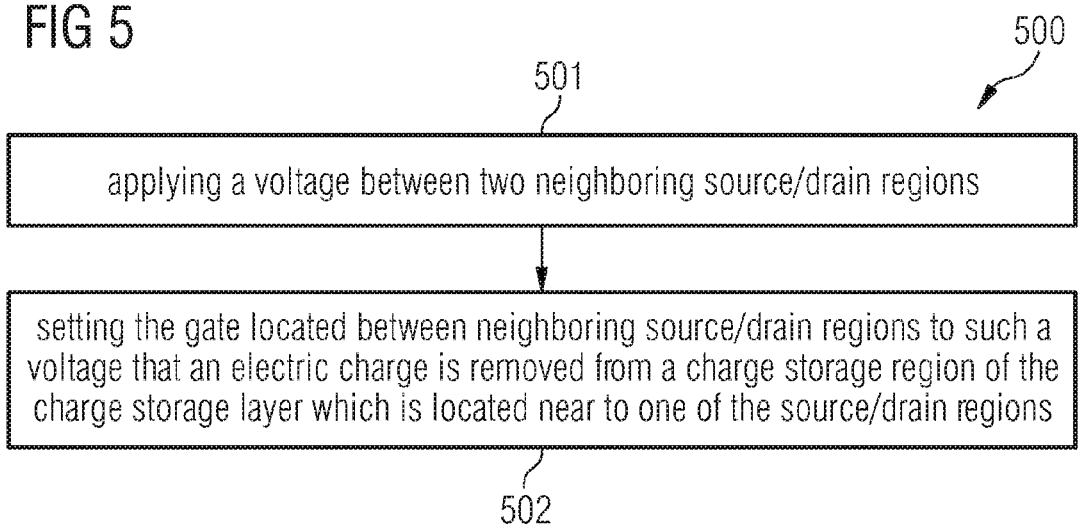
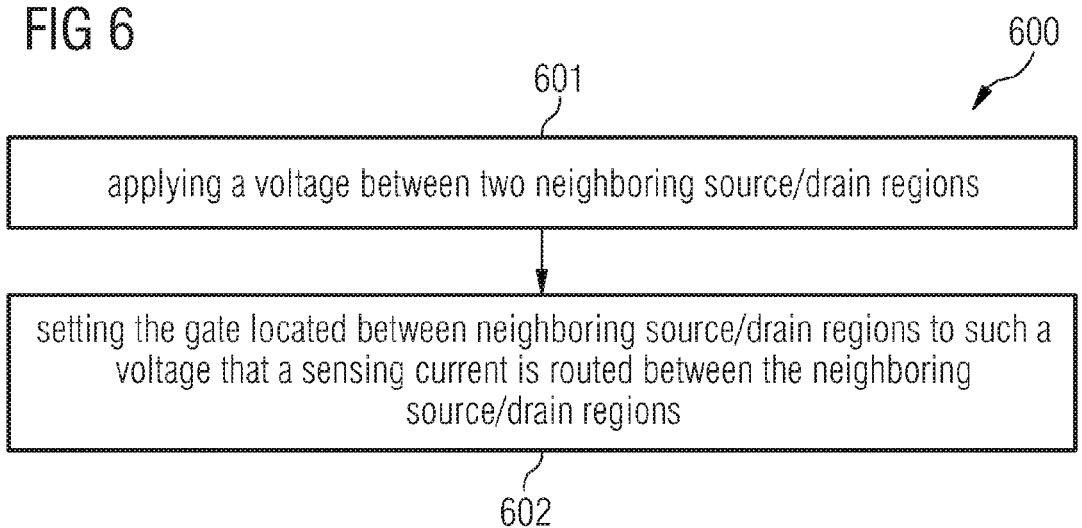

FIG 7

| Operation type | S/D line n | S/D line n+1 | Other S/D lines | Gate line m | Other gate lines |
|---|---|---|---|---|---|
| Read | 0 V | 1.6 V | floating | 4 V | 0 V |
| Program | 5 V | 0 V | floating | 8 V | 0 V |
| Erase | 5 V | 0 V | floating | -7 V | 0 V |

MEMORY DEVICE HAVING CROSS-SHAPED SEMICONDUCTOR FIN STRUCTURE

TECHNICAL FIELD

Embodiments of the present invention relate generally to memory devices, and, in particular, to field effect memory devices.

BACKGROUND

Field effect memory devices are known in the art. Examples include devices which are floating gate devices as well as devices which are charge trapping devices. In view of the rapid development in computer technology, there is a need for a field effect memory device having an increased bit density.

SUMMARY OF THE INVENTION

An embodiment of the invention is a memory device, comprising: a semiconductor fin structure, each end portion of the fin structure comprising a source/drain region; a charge storage layer covering at least a portion of the fin structure; and a gate layer covering at least a portion of the charge storage layer. In an embodiment, the fin structure may be cross shaped. In an embodiment, the fin structure may consist essentially of a single fin element.

BRIEF DESCRIPTION OF THE DRAWINGS

In the drawings, like reference characters generally refer to the same portions throughout the different views. The drawings are not necessarily to scale, emphasis instead generally being placed upon illustrating the principles of the invention. In the following description, various embodiments of the invention are described with reference to the following drawings, in which:

FIG. 5 shows a flow chart of a method of operating a fin field effect memory cell according to one embodiment of the present invention;

FIG. 6 shows a flow chart of a method of operating a fin field effect memory cell according to one embodiment of the present invention; and FIG. 7 shows possible voltages usable in conjunction with memory cells and memory cell arrays shown in FIGS. 1 and 2.

DETAILED DESCRIPTION OF ILLUSTRATIVE EMBODIMENTS

Figure 1:
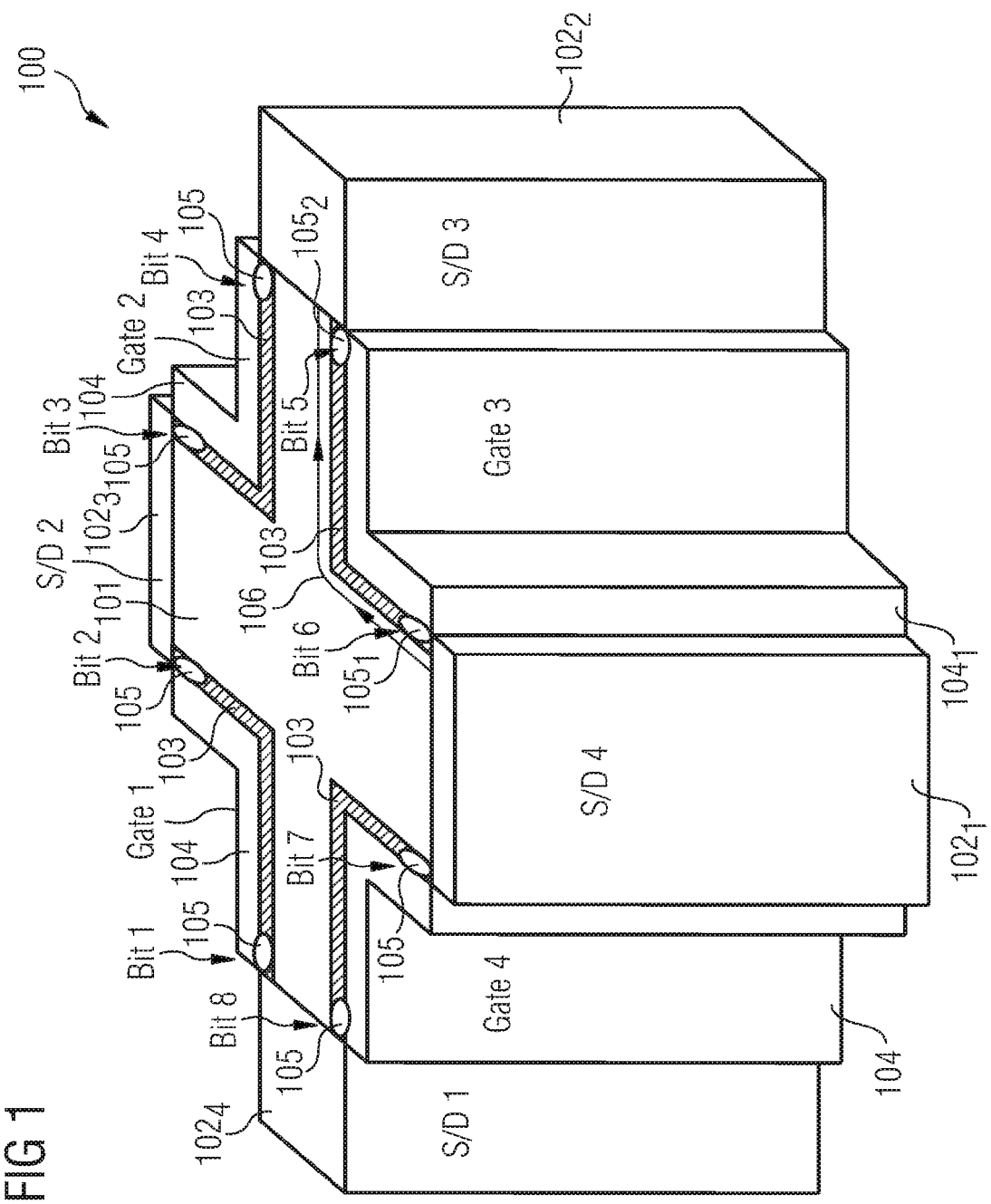
FIG. 1 shows a perspective view of a fin field effect memory cell according to one embodiment of the present invention.

According to one embodiment of the present invention, a fin field effect memory cell is provided, comprising: a semiconductor fin structure, wherein each end portion of the semiconductor fin structure includes a source/drain region; a charge storage layer covering at least a portion of the surface of the semiconductor fin structure; and a gate layer covering at least a portion of the charge storage layer. In an embodiment, the charge storage layer may include at least one charge storage region between two neighboring source/drain regions. In an embodiment, the charge storage layer may include only one charge storage region between two neighboring source/drain regions. In an embodiment, the electric charges can be injected into the at least one charge storage region or removed therefrom by applying corresponding potentials to the source/drain regions and to the gate layer.

In an embodiment of the present invention, the fin field effect memory cell may be a charge trapping memory cell, wherein the charge storage layer is a charge trapping layer. In an embodiment, the memory cell and charge trapping layer may be such that at least two different charge storage regions are located between two neighboring source/drain regions. In an embodiment, the memory cell and charge trapping layer may be such that only two different charge storage regions are located between two neighboring source/drain regions. Each charge storage region may be spacedly disposed from another charge storage region. Also, in an embodiment, each charge storage region may be independently controlled.

In an embodiment, the fin structure may consist essentially of a single fin element. The source/drain regions may be located on opposite ends of the fin element. In an embodiment, a vertical cross section of the fin element (slicing the fin in a direction which is perpendicular to its length) may be omega shaped.

In an embodiment, the fin structure may be a cross-shaped fin structure. In one embodiment, the cross-shaped fin structure may include fin elements which are arranged substantially perpendicular (90°) with respect to each other. In another embodiment, the cross-shaped fin structure may include fin elements which are arranged such that the fin elements intersect but are not perpendicular to each other. For example, the cross-shaped structure may be an X-shape structure.

In an embodiment, a charge storage layer may cover at least a portion of the surface the fin structure. In an embodiment, a charge storage layer may cover a portion of the surface the fin structure. In an embodiment, the charge storage layer may cover at least a portion of the surface of the side walls of the fin structure. In one embodiment, the charge storage layer may contact the side walls. In another embodiment, the charge storage layer need not contact the side walls so that there may be one or more additional layers between the fin side walls and the charge storage layer.

In one embodiment, the gate layer may contact the charge storage layer. However, this does not have to be the case and it is possible that one or more additional layer layers are disposed between the gate layer and the charge storage layer. In an embodiment, the gate layer may be divided into four separate portions, each portion serving as one gate, wherein each gate is located between two neighboring source/drain regions.

In an embodiment, the memory cell is a charge trapping memory cell and the charge storage layer may be a charge trapping layer. In an embodiment, the charge trapping layer comprises an oxide layer, a nitride layer, and an oxide layer stacked above each other in this order. In an embodiment of the present invention, the charge storage layer consists essentially of an oxide layer, a nitride layer, and an oxide layer stacked above each other in this order. Each oxide layer may be a silicon oxide layer (such as a silicon dioxide layer). The nitride layer may be an silicon nitride layer.

In another embodiment, the charge trapping layer may comprise a nanocrystal layer.

In an embodiment, the length of each of the current paths which connect neighboring source/drain regions with each other may be greater than F. In an embodiment, the length of each of the current paths which connect neighboring source/drain regions with each other may be less than about 2 F. In an embodiment, "F" may be a minimum feature size of the memory cell. In an embodiment, "F" may be the photolithographic limit of the manufacturing process used.

In an embodiment of the present invention, the length of the shortest current paths connecting neighboring source/drain regions with each other is at least 80 nm. In an embodiment, the length of the shortest current paths connecting neighboring source/drain regions with each other is at least 100 nm. In an embodiment, the length of the shortest current paths connecting neighboring source/drain regions with each other is about 110 nm.

In an embodiment of the present invention, the fin field effect memory cell may be a floating gate memory cell, and the charge storage layer is a floating gate layer. The memory cell and the floating gate layer may be set up such that the floating gate layer has only one charge storage region located between two neighboring source/drain regions. Hence, the floating gate layer may have a single charge storage region between each two neighboring source/drain regions. The floating gate layer may, for example, be isolated from the semiconductor fin structure by a dielectric layer such as an oxide layer. Hence, a dielectric layer (such as an oxide layer) may be disposed between the floating gate layer and the fin structure. As an example, the floating gate layer may be a polysilicon layer such as a doped polysilicon layer.

In another embodiment, a fin field effect memory cell is provided comprising a plurality of semiconductor fins. Each semiconductor fin includes two end portions where each end portion forms a source/drain region. Each semiconductor fin may include a fin middle portion located between the source/drain regions of the fin. It is, of course, realized that the middle portion need not be at the center of the fin. All the fins together form a semiconductor fin structure including a common fin portion which forms the fin middle portion of each semiconductor fin. A charge storage layer is provided covering at least a portion of the surface of the semiconductor fin structure. The charge storage layer may cover at least a portion of the surface of the side walls of the semiconductor fin structure. In an embodiment, the charge storage layer may contact the fin structure. However, this does not have to be the case so that there may be one or more additional layers disposed between the charge storage layer and the fin structure. A gate layer may be provided covering at least a portion of the charge storage layer. In an embodiment, the gate layer may contact the charge storage layer. However, this does not have to be the case, so that there may be one or more additional layers between the gate layer and the charge storage layer.

In an embodiment, the charge storage layer may be set up such that the charge storage layer includes at least one charge storage region between two neighboring source/drain regions. Electric charges may be injected into the at least one charge storage region or removed therefrom by applying corresponding potentials to the source/drain regions and to the gate layer.

In an embodiment, the charge storage layer may have only one charge storage region between two neighboring source/drain regions. In another embodiment, the charge storage layer may have only two charge storage regions between two neighboring source/drain regions. In another embodiment, the charge storage layer may have more than two charge storage regions between two neighboring source/drain regions.

According to one embodiment of the present invention, the fin field effect memory cell is a charge trapping memory cell, wherein the charge storage layer is a charge trapping layer. The charge trapping layer may be set up such that there are two different (for example, spacedly disposed) charge storage regions located between two neighboring source/drain regions. The charge trapping layer may be set up such that there are two or more different charge storage regions located between two neighboring source/drain regions. There may be two or more different charge storage regions between each pair of two neighboring source/drain regions.

In an embodiment of the present invention, the charge storage layer comprises an oxide layer, a nitride layer, and an oxide layer stacked above each other in this order. In an embodiment, the charge storage layer consists essentially of an oxide layer, a nitride layer and an oxide layer stacked above each other in this order. Each of the oxide layers may be a silicon oxide layer (such as a silicon dioxide layer). The nitride layers may be a silicon nitride layer. In an embodiment, the charge trapping layer may comprise a nanocrystal layer.

In an embodiment of the present invention, the charge storage layer covers at least a portion of the side walls of the semiconductor fin structure.

According to one embodiment of the present invention, the gate layer is divided into a plurality of separate portions, each portion serving as one gate, wherein each gate is located between two neighboring source/drain regions.

According to one embodiment of the present invention, the length of current paths which connect neighboring source/drain regions with each other is larger than F. In one or more embodiments, the length of the current paths which connect neighboring source/drain regions with each other is less than about 2 F. "F" may be a minimum feature size of the cell. In an embodiment, "F" may be a photolithographic limit of the process used to make the cell.

In an embodiment of the present invention, the length of the shortest current paths connecting neighboring source/drain regions with each other is at least 80 nm. In an embodiment, the length of the shortest current paths connecting neighboring source/drain regions with each other is at least 100 nm. In an embodiment, the length of the shortest current paths connecting neighboring source/drain regions with each other is about 110 nm.

According to an embodiment of the present invention, at least one charge storage region exists between two neighboring source/drain regions. According to an embodiment of the present invention, only one storage region exists between two neighboring source/drain regions.

According to an embodiment of the present invention, at least two charge storage regions exist between two neighboring source/drain regions. According to an embodiment of the present invention, only two charge storage regions exist between two neighboring source/drain regions, each charge storage region being disposed proximate to a different source/drain region.

According to one embodiment of the present invention, the fin field effect memory cell is a floating gate memory cell, and the charge storage layer is a floating gate layer which is set up such that the floating gate layer includes only one charge storage region located between two neighboring source/drain regions. The floating gate layer may, for example, be isolated against the semiconductor fin structure by an oxide layer. In another embodiment, it is possible that the floating gate layer includes more than one charge storage region between two neighboring source/drain regions. In an embodiment, each charge storage region may be spacedly disposed from another. In an embodiment, each charge storage region may be independently controlled.

According to one embodiment of the present invention, a fin field effect memory cell array including a plurality of memory cells is provided, each memory cell including: a cross-shaped semiconductor fin structure, wherein each end portion of the semiconductor fin structure forms a source/drain region; a charge storage layer covering a portion of the surface of the semiconductor fin structure; a gate layer covering at least a portion of the charge storage layer. In an embodiment, the charge storage layer may include only one charge storage region between two neighboring source/drain regions. In another embodiment, the charge storage layer may include only two charge storage regions between two neighboring source/drain regions. In another embodiment, the charge storage layer may include more than two charge storage regions between two neighboring source/drain regions. In an embodiment, electric charges may be injected into the charge storage regions or removed therefrom by applying corresponding potentials to the source/drain regions and to the gate layer.

According to one embodiment of the present invention, the charge storage layer covers at least a portion of the side walls of the semiconductor fin structure.

According to one embodiment of the present invention, the gate layer is divided into four separate portions, each portion serving as one gate, wherein each gate is located between two neighboring source/drain regions.

According to one embodiment of the present invention, a plurality of source/drain lines and a plurality of gate lines are provided, wherein each source/drain region is connected to a source/drain line, and wherein each gate is connected to a gate line.

According to one embodiment of the present invention the source/drain lines and the gate lines are arranged perpendicular to each other.

According to one embodiment of the present invention, within one memory cell, three source/drain lines are used to contact the source/drain regions, and wherein two gate lines are used to contact the gates.

According to one embodiment of the present invention, a method of operating a fin field effect memory cell is provided, including: a cross-shaped semiconductor fin structure, wherein each end portion of the semiconductor fin structure forms a source/drain region; a charge storage layer covering at least a portion of the side walls of the semiconductor fin structure located between the source/drain regions; four gates, each gate being provided on the charge storage layer between two neighboring source/drain regions, the method including: applying a voltage between two neighboring source/drain regions; setting the gate located between neighboring source/drain regions to such a voltage that an electric charge is injected into a charge storage region of the charge storage layer which is located near to one of the source/drain regions.

According to one embodiment of the present invention, the voltage between the two neighboring source/drain regions is about 5V, wherein the gate is set to about 8V.

According to one embodiment of the present invention, a method of operating a fin field effect memory cell is provided, including: a cross-shaped semiconductor fin structure, wherein each end portion of the semiconductor fin structure forms a source/drain region; a charge storage layer covering at least a portion of the side walls of the semiconductor fin structure located between the source/drain regions; four gates, each gate being provided on the charge storage layer between two neighboring source/drain regions. The method includes: applying a voltage between two neighboring source/drain regions; setting the gate located between neighboring source/drain regions to such a voltage that an electric charge is removed from a charge storage region of the charge storage layer which is located near to one of the source/drain regions.

According to one embodiment of the present invention, the voltage between the two neighboring source/drain regions is about 5V, and the gate is set to −7V.

According to one embodiment of the present invention, a method of operating a fin field effect memory cell is provided, including: a cross-shaped semiconductor fin structure, wherein each end portion of the semiconductor fin structure forms a source/drain region; a charge storage layer covering at least a portion of the side walls of the semiconductor fin structure located between the source/drain regions; four gates, each gate being provided on the charge storage layer between two neighboring source/drain regions. The method includes: applying a voltage between two neighboring source/drain regions; setting the gate located between neighboring source/drain regions to such a voltage that a sensing current is routed between the neighboring source/drain regions.

According to one embodiment of the present invention, the voltage between the two neighboring source/drain regions is about 1.6V, wherein the gate is set to about 4V.

FIG. 1 shows a fin field effect memory cell 100 according to one embodiment of the present invention. The fin field effect memory cell 100 includes a cross-shaped semiconductor fin structure 101, wherein each end portion of the semiconductor fin structure 101 forms a source/drain region 102; a charge storage layer 103 covering a portion of the surface of the semiconductor fin structure 101; a gate layer 104 covering at least a portion of the charge storage layer 103, wherein the charge storage layer 103 is set up such that at least two different charge storage regions 105 are located between two neighboring source/drain regions 102, wherein electric charges can be injected into the charge storage regions 105 or removed therefrom by applying corresponding potentials to the source/drain regions 102 and to the gate layer 104.

Due to the cross-shaped semiconductor fin structure 101, it is possible to store at least eight bits of information within one single fin field effect memory cell 100. As a consequence, the bit density of the fin field effect memory cell 100 can be increased.

In this embodiment, the charge storage layer 103 only covers a portion of the side walls of the semiconductor fin structure 101. However, the charge storage layer 103 may also cover other portions of the semiconductor fin structure 101.

In this embodiment, the gate layer 104 is divided into four separate portions, each portion serving as one gate, wherein each gate is located between two neighboring source/drain regions 102. However, the invention is not restricted thereto; each gate shown in this embodiment may also be divided into several subgates. In this way, the number of charge storage regions 105 (i.e., the bit density) between two neighboring source/drain regions, for example, between the neighboring source/drain regions $102_1$ and $102_2$, can be further increased.

According to one embodiment of the present invention, the charge storage layer 103 includes or consists of a silicon oxide layer, a silicon nitride layer, and a silicon oxide layer stacked above each other in this order.

According to one embodiment of the present invention, the length of current paths (e.g., current path 106) which connects neighboring source/drain regions 102 with each other is greater than F but less than 2 F where "F" is the minimum feature size of the device.

According to one embodiment of the present invention, the length of the shortest current paths 106 connecting neighboring source/drain regions 102 with each other is at least 80 nm. According to one embodiment of the present invention, the length of the shortest current paths 106 connecting neighboring source/drain regions 102 with each other is at least 100 nm. According to one embodiment of the present invention, the length of the shortest current paths 106 connecting neighboring source/drain regions 102 with each other is about 110 nm.

In the embodiment shown in FIG. 1, two charge storage regions 105 exist between two neighboring source/drain regions 102, each charge storage region 105 being disposed proximate to a different source/drain region.

Up to now, it has been assumed that the fin field effect memory cell 100 is a charge trapping memory cell, wherein the charge storage layer 103 is a charge trapping layer which is set up such that at least two different charge storage regions 105 are located between two neighboring source/drain regions 102. Alternatively, according to one embodiment of the present invention, the fin field effect memory cell 100 is a floating gate memory cell, and the charge storage layer 103 is a floating gate layer which is set up such that one charge storage region 105 is located between two neighboring source/drain regions 102. The floating gate layer may, for example, be isolated against the semiconductor fin structure 101 by an oxide layer. Since the floating gate layer is typically a conductive layer, only one charge storage region 105 can be formed within a continuous floating gate layer. However, the floating gate layer may be split into a plurality of floating gate sublayers isolated against each other, each floating gate sublayer being covered by a separate gate layer 104. In this way, the memory density of the fin field effect memory cell 100 can be further increased.

Figure 2:
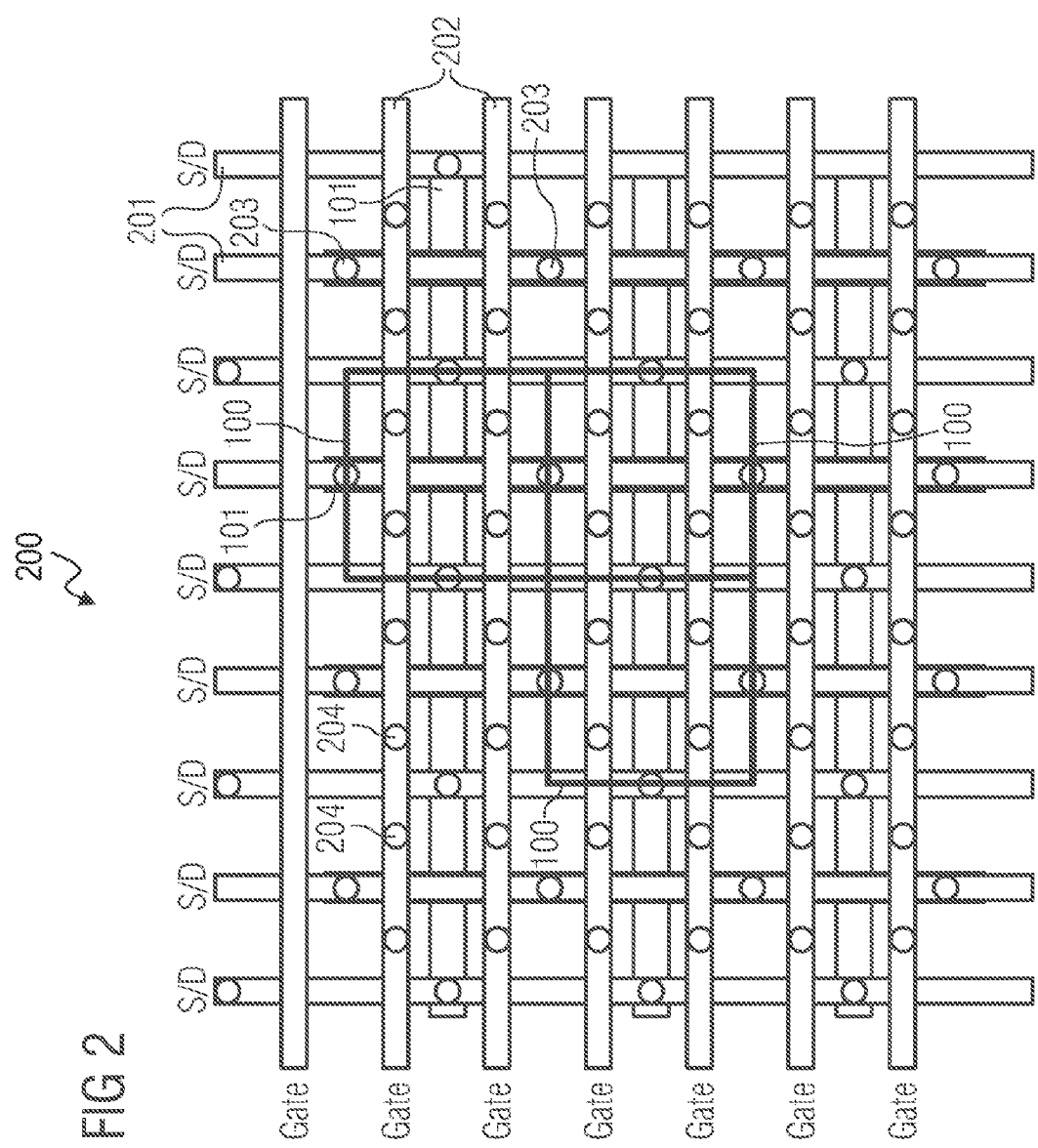
FIG. 2 shows a top view of a fin field effect memory cell array according to one embodiment of the present invention.

FIG. 2 shows a fin field effect memory cell array 200 according to one embodiment of the present invention. The fin field effect memory cell array 200 includes a plurality of memory cells according to one embodiment of the present invention. In the following description, it is assumed that the memory cells are memory cells 100 as shown in FIG. 1. That is, each memory cell includes: a cross-shaped semiconductor fin structure 101, wherein each end portion of the semiconductor fin structure 101 forms a source/drain region 102; a charge storage layer 103 covering a portion of the surface of the semiconductor fin structure 101; a gate layer 104 covering at least a portion of the charge storage layer 103, wherein the charge storage layer 103 is set up such that at least two different charge storage regions 105 are located between two neighboring source/drain regions 102, wherein electric charges can be injected into the charge storage regions 105 or removed therefrom by applying corresponding potentials to the source/drain regions 102 and to the gate layer 104. The charge storage layer 103 covers at least a portion of the side walls of the semiconductor fin structure 101. The gate layer 104 is divided into four separate portions, each portion serving as one gate, wherein each gate is located between two neighboring source/drain regions 102. The memory cell array 200 further includes a plurality of source/drain lines 201 and a plurality of gate lines 202, wherein each source/drain region 102 is connected to a source/drain line 201 via a source/drain contact 203, and wherein each gate 104 is connected to a gate line 202 via a gate contact 204. The source/drain lines 201 and the gate lines 202 are arranged perpendicular to each other. As can be derived from FIG. 2, within one memory cell, three neighboring source/drain lines 201 are used to contact the source/drain regions, and two neighboring gate lines 202 are used to contact the gates.

Since the height of the semiconductor fin structure 101 can be arbitrarily adjusted, the current density between two neighboring source/drain regions 102 can be arbitrarily adjusted.

Figure 3:
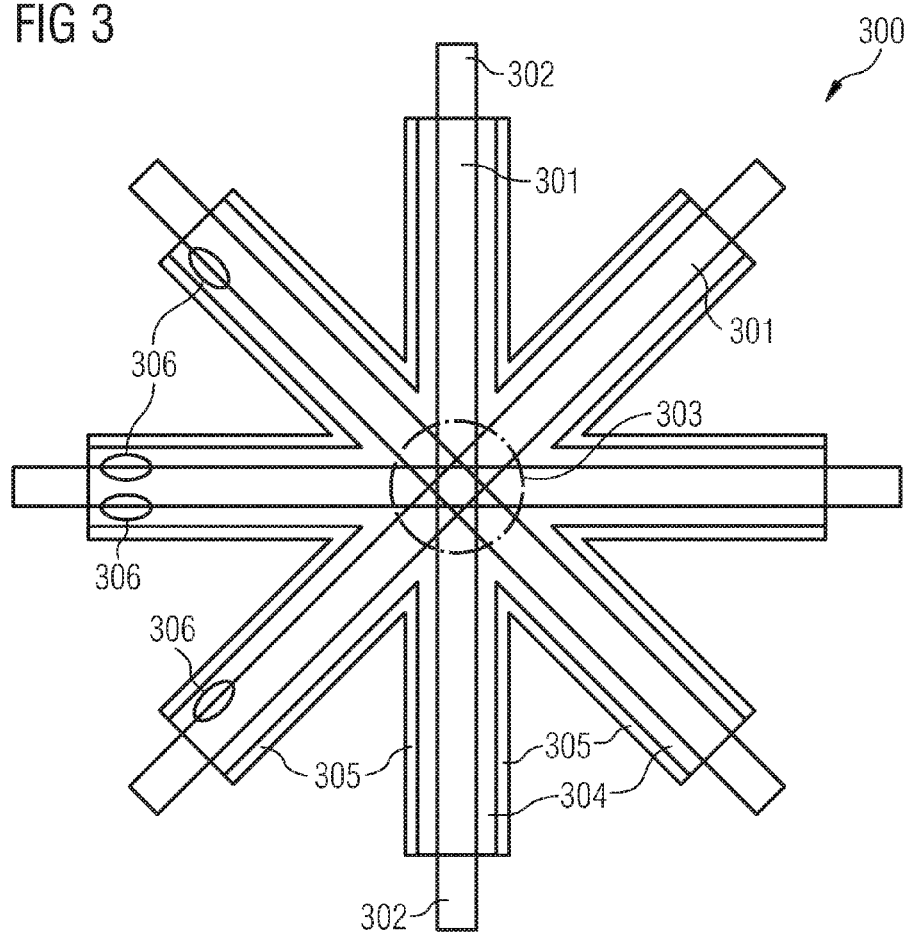
FIG. 3 shows a perspective view of a fin field effect memory cell according to one embodiment of the present invention.

FIG. 3 shows a fin field effect memory cell 300 according to one embodiment of the present invention. The memory cell 300 includes: a plurality of semiconductor fins 301, wherein each semiconductor fin 301 includes two end portions, wherein each end portion forms a source/drain region 302, wherein each semiconductor fin 301 comprises a fin middle portion which is located between the source/drain regions 302 of the fin 301, and wherein all fins 301 together form a semiconductor fin structure comprising a common fin portion 303 which forms the fin middle portion of each semiconductor fin 301; a charge storage layer 304 covering a portion of the surface of the semiconductor fin structure; and a gate layer 305 covering at least a portion of the charge storage layer 304, wherein the charge storage layer 304 is set up such that at least two different charge storage regions 306 are located between two neighboring source/drain regions 302, wherein electric charges can be injected into the charge storage regions 306 or removed therefrom by applying corresponding potentials to the source/drain regions 302 and to the gate layer 305.

The number of fins 301 is arbitrary. In this way, an arbitrary number of charge storage regions 306 can be integrated into one fin field effect memory cell. The only thing which has to be ensured is that the fins 301 are electrically connected with each other by having a common fin portion 303.

All embodiments explained in conjunction with the fin field effect memory cell 100 shown in FIG. 1 can also be applied to the fin field effect memory cell 300 shown in FIG. 3.

Figure 4:
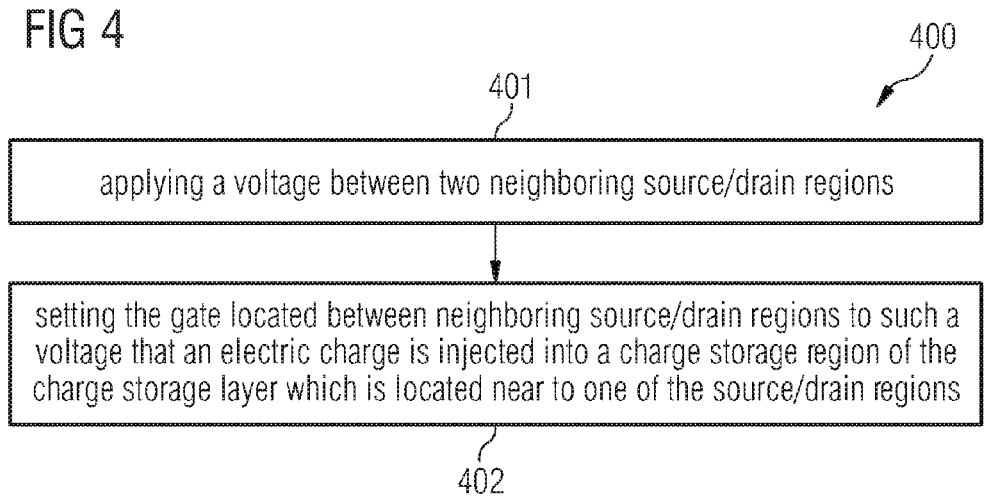
FIG. 4 shows a flow chart of a method of operating a fin field effect memory cell according to one embodiment of the present invention.

FIG. 4 shows a method 400 of operating a fin field effect memory cell according to one embodiment of the present invention. The memory cell includes a cross-shaped semiconductor fin structure, wherein each end portion of the semiconductor fin structure forms a source/drain region, a charge storage layer covering at least a portion of the side walls of the semiconductor fin structure located between the source/drain regions, and four gates, each gate being provided on the charge storage layer between two neighboring source/drain regions. At 401, a voltage is applied between two neighboring source/drain regions. At 402, the gate located between neighboring source/drain regions is set to such a voltage that an electric charge is injected into a charge storage region of the charge storage layer which is located near to one of the source/drain regions.

For example, making reference to FIG. 1, a voltage may be applied between the two neighboring source/drain regions $102_1$ and $102_2$. Then, the gate $104_1$ located between the neighboring source/drain regions $102_1$ and $102_2$ is set to such a voltage that an electric charge is injected into the charge storage region $105_1$ of the charge storage layer 103. In order to inject an electric charge into the charge storage region $105_2$ of the charge storage layer 103, the voltage applied between the two neighboring source/drain regions $102_1$ and $102_2$ has to be reversed.

According to one embodiment of the present invention, the voltage between the two neighboring source/drain regions $102_1$ and $102_2$ is about 5V, wherein the gate $104_1$ is set to about 8V.

FIG. 5 shows a method 500 of operating a fin field effect memory cell according to one embodiment of the present invention. The fin field effect memory cell includes a cross-shaped semiconductor fin structure, wherein each end portion of the semiconductor fin structure forms a source/drain region, a charge storage layer covering at least a portion of the side walls of the semiconductor fin structure located between the source/drain regions, and four gates, each gate being provided on the charge storage layer between two neighboring source/drain regions. At 501, a voltage is applied between two neighboring source/drain regions. At 502, the gate located between neighboring source/drain regions is set to such a voltage that an electric charge is removed from a charge storage region of the charge storage layer which is located near to one of the source/drain regions.

For example, making reference to FIG. 1, a voltage may be applied between the two neighboring source/drain regions $102_1$ and $102_2$. Then, the gate $104_1$ located between the neighboring source/drain regions $102_1$ and $102_2$ is set to such a voltage that an electric charge is removed from the charge storage region $105_1$ of the charge storage layer 103. In order to remove an electric charge from the charge storage region $105_2$ of the charge storage layer 103, the voltage applied between the two neighboring source/drain regions $102_1$ and $102_2$ has to be reversed.

According to one embodiment of the present invention, the voltage between the two neighboring source/drain regions $102_1$ and $102_2$ is about 5V, wherein the gate $104_1$ is set to about −7V.

FIG. 6 shows a method 600 of operating a fin field effect memory cell according to one embodiment of the present invention. The memory cell includes a cross-shaped semiconductor fin structure, wherein each end portion of the semiconductor fin structure forms a source/drain region, a charge storage layer covering at least a portion of the side walls of the semiconductor fin structure located between the source/drain regions, and four gates, each gate being provided on the charge storage layer between two neighboring source/drain regions. At 601, a voltage is applied between two neighboring source/drain regions. At 602, the gate located between neighboring source/drain regions is set to such a voltage that a sensing current is routed between the neighboring source/drain regions.

For example, making reference to FIG. 1, a voltage may be applied between the two neighboring source/drain regions $102_1$ and $102_2$. Then, the gate $104_1$ located between the neighboring source/drain regions $102_1$ and $102_2$ is set to such a voltage that a sensing current is routed via the current path 106 from the source/drain regions $102_1$ to the source/drain region $102_2$. The strength of the current routed via the current path 106 from the source/drain regions $102_1$ to the source/drain region $102_2$ is dependent on the charges stored within the charge storage regions $105_1$ and $105_2$. In this way, the states of the bits (bit 5 represented by the charge stored within the charge storage region $105_2$ and bit 6 represented by the charge stored within the charge storage region $105_1$) can be sensed.

According to one embodiment of the present invention, the voltage between the two neighboring source/drain regions $102_1$ and $102_2$ is about 1.6V, wherein the gate $104_1$ is set to about 4V.

Due to the cross-shaped semiconductor fin structure, it is possible to store at least eight bits of information within one single fin field effect memory cell. As a consequence, the bit density of the fin field effect memory cell can be increased.

According to one embodiment of the present invention, the fin field effect memory cell and the fin field effect memory cell array are SOI (Silicon On Insulator) based memory cells/memory cell arrays.

In the following description, further aspects of exemplary embodiments of the present invention will be explained.

The increasing demand for non-volatile data storage capacity is driving industry towards scaling down their memory devices (i.e., the number of stored bits per memory device has to be increased). A goal to be achieved is to increase the overall bit density and to reduce the cost per bit.

A floating gate device can store only one physical bit. This can be compensated for by using multi-level encoding. Scaling down a multi-level device makes it more and more difficult to maintain the multi-level encoding due to the stringent retention specifications. Planar charge trapping devices like NROM devices can store two physical bits per device. However, future scaling is questionable because of possible cross-talk. The two bits, each stored at one end of the device channel, start interfering when reducing the gate length. Instead of using a planar NROM device, a vertical fin NROM (Nitrided Read Only Memory) device can be used which is able to store up to four bits. However, the cross-talk issue still limits scalability.

According to one embodiment of the present invention, a fin field effect memory device is provided which improves both scalability and number of bits per device. By extending the concept of fin based charge trapping devices towards a cross-shaped fin, the number of stored bits can be doubled towards eight bits per device. This results in a density of 2 $F^2$/bit.

Besides this high density, the scalability is enhanced, compared to planar NROM and FinFLASH. The channels are not straight, resulting in a channel length above F. In the ideal case, 2 F can be obtained, but by lithography rounding results in a value around 1.5 F. This is a significant improvement compared to the maximum gate length F for devices having straight channels.

FIG. 1 displays a view in perspective of the crossed device. The four ends of the cross are contacted with source/drain junctions, and the sidewalls in between may, for example, be covered by an oxide/nitride/oxide stack, capped by four gate contacts. Due to this lay-out, the cross comprises four individual devices, each capable of storing 2 bits, as a normal planar NROM device. Each individual bit can be read-out by biasing the corresponding pair of S/D junctions in the right direction (the bit at the source junction is determining whether the channel is on or off).

FIG. 2 shows an example of the array lay-out that accommodates the cross-fin device on a 16 $F^2$ area (black square). Divided by eight physical bits, this yields an area of 2 $F^2$ per bit. To access the forward bit on the $n^{th}$ S/D line and $m^{th}$ gate line the following typical voltages have to be applied, as presented in FIG. 7.

Program and erase have the opposite S/D bias with respect to the read-out, corresponding to planar NROM devices. Gate voltages during programming are highly positive to enable hot electrons, generated by the high source drain-bias, to be injected into the nitride (charge storage layer). Hole injection for erasure has similar biasing, although with strongly negative gate bias. The non-selected S/D lines may be kept at a floating level to avoid unintentional charge injection on unselected devices along the selected gate line. For the unselected gate lines it is sufficient to keep them at ground, or slightly negative. At such gate bias, no programming/erasing action will take place, and no current will flow through the device.

To access the reverse bit, the table as shown in FIG. 7 can be used again, with only the bias of S/D line n and n+1 exchanged. With these typical operating bias conditions it is possible to program, erase and read each bit individually.

According to one embodiment of the present invention, by introducing the cross-shaped localized charge trapping device, a high density can be obtained, both from a $F^2$ point of view as well as from a scalability point of view. The combination of $F^2$ per bit and a channel length significantly larger than F makes the above approach very attractive and cost effective for future generations of flash memory.

FIG. 2 shows how the proposed cross-shaped device can be successfully integrated into a high density random access array. This does not exclude implementation in other types of memory arrays like NAND, i.e., embodiments of the present invention are also applicable to other types of memory arrays.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A fin field effect memory cell, comprising:
   a cross-shaped semiconductor fin structure having four end portions, each end portion of the semiconductor fin structure including a source/drain region;
   a charge storage layer covering at least a portion of the fin structure; and
   a gate layer covering at least a portion of the charge storage layer.

2. The memory cell of claim 1, wherein the charge storage layer covers at least a portion of side walls of the fin structure.

3. The memory cell of claim 1, wherein the gate layer is divided into four separate portions, each portion serving as one gate, each gate disposed between two neighboring source/drain regions.

4. The memory cell of claim 1, wherein the charge storage layer comprises an oxide layer, a nitride layer and an oxide layer stacked above each other in this order.

5. The memory cell of claim 1, wherein the charge storage layer comprises a nanocrystal layer.

6. The memory cell of claim 1, wherein the charge storage layer includes at least two charge storage regions between two neighboring source/drain regions.

7. The memory cell of claim 1, wherein the charge storage layer comprises a floating gate layer.

8. The memory cell of claim 1, wherein the charge storage layer includes only a single charge storage region between two neighboring source/drain regions.

9. The memory cell of claim 1, wherein the charge storage layer comprises a polysilicon layer.

10. A fin field effect memory cell, comprising:
    a plurality of semiconductor fins, each fin comprising two end portions, each end portion including a source/drain region, each fin comprising a fin middle portion which is located between the source/drain regions of the fin, all of the fins together forming a semiconductor fin structure comprising a common fin portion which forms the fin middle portion of each semiconductor fin;
    a charge storage layer covering at least a portion of the semiconductor fin structure; and
    a gate layer covering at least a portion of the charge storage layer.

11. The memory cell of claim 10, wherein the gate layer is divided into a plurality of separate portions, each portion serving as one gate, each gate being located between two neighboring source/drain regions.

12. The memory cell of claim 10, wherein the charge storage layer comprises an oxide layer, a nitride layer and an oxide layer stacked above each other in this order.

13. The memory cell of claim 10, wherein the charge storage layer comprises a nanocrystal layer.

14. The memory cell of claim 10, wherein the charge storage layer includes at least two charge storage regions between two neighboring source/drain regions.

15. The memory cell of claim 10, wherein the charge storage layer comprises a floating gate layer.

16. The memory cell of claim 10, wherein the charge storage layer includes only a single charge storage region disposed between two neighboring source/drain regions.

* * * * *